United States Patent
Chu et al.

(10) Patent No.: US 9,773,884 B2
(45) Date of Patent: Sep. 26, 2017

(54) III-NITRIDE TRANSISTOR WITH ENGINEERED SUBSTRATE

(71) Applicant: HRL LABORATORIES, LLC, Malibu, CA (US)

(72) Inventors: Rongming Chu, Newbury Park, CA (US); Zijan Ray Li, Oak Park, CA (US); Karim Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/838,546

(22) Filed: Mar. 15, 2013

(65) Prior Publication Data

US 2014/0264361 A1    Sep. 18, 2014

(51) Int. Cl.
| | |
|---|---|
| H01L 29/778 | (2006.01) |
| H01L 29/06 | (2006.01) |
| H01L 21/683 | (2006.01) |
| H01L 29/66 | (2006.01) |
| H01L 29/20 | (2006.01) |

(52) U.S. Cl.
CPC .... *H01L 29/66462* (2013.01); *H01L 21/6835* (2013.01); *H01L 29/0649* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 4,537,654 | A | 8/1985 | Berenz et al. |
| 6,476,431 | B1 | 11/2002 | Ohno et al. |
| 6,611,002 | B2 | 8/2003 | Weeks et al. |
| 7,026,665 | B1 | 4/2006 | Smart et al. |
| 7,038,252 | B2 | 5/2006 | Saito et al. |
| 7,098,490 | B2 | 8/2006 | Micovic et al. |
| 7,125,786 | B2 | 10/2006 | Ring et al. |
| 7,470,941 | B2 | 12/2008 | Micovic et al. |
| 7,498,618 | B2 | 3/2009 | Saito et al. |

(Continued)

FOREIGN PATENT DOCUMENTS

| | | |
|---|---|---|
| CN | 102820325 A | 12/2012 |
| JP | 2012/084653 A | 4/2012 |

(Continued)

OTHER PUBLICATIONS

Bin Lu and Tomas Palacios, "High Breakdown (>1500V) AlGaN/GaN HEMTs by Substrate-Transfer," IEEE Electron Device Letters, vol. 31, No. 9, pp. 951-953, Sep. 2010.

(Continued)

*Primary Examiner* — Jay C Chang
(74) *Attorney, Agent, or Firm* — Ladas & Parry

(57) ABSTRACT

A transistor includes a buffer layer, a channel layer over the buffer layer, a barrier layer over the channel layer, a source electrode electrically connected to the channel layer, a drain electrode electrically connected to the channel layer, a gate electrode on the barrier layer between the source electrode and the drain electrode, a backside metal layer, a substrate between a first portion of the buffer layer and the backside metal layer; and a dielectric between a second portion of the buffer layer and the backside metal layer.

14 Claims, 5 Drawing Sheets

(56) References Cited

U.S. PATENT DOCUMENTS

| | | | |
|---|---|---|---|
| 7,566,913 B2 | 7/2009 | Therrien et al. | |
| 7,576,373 B1* | 8/2009 | Hikita et al. | 257/192 |
| 7,745,848 B1* | 6/2010 | Rajagopal et al. | 257/192 |
| 7,888,713 B2 | 2/2011 | Kawasaki | |
| 8,872,235 B2* | 10/2014 | Prechtl | H01L 29/66462 257/195 |
| 2002/0182855 A1* | 12/2002 | Agarwala et al. | 438/638 |
| 2003/0080349 A1* | 5/2003 | Quaglietta | H01L 23/4821 257/197 |
| 2003/0230746 A1* | 12/2003 | Stasiak | 257/40 |
| 2004/0130002 A1 | 7/2004 | Weeks et al. | |
| 2005/0233600 A1 | 10/2005 | See et al. | |
| 2006/0065910 A1 | 3/2006 | Ring et al. | |
| 2006/0073621 A1 | 4/2006 | Kneissel et al. | |
| 2007/0001314 A1* | 1/2007 | Seo | H01L 23/49816 257/778 |
| 2007/0051977 A1 | 3/2007 | Saito et al. | |
| 2007/0069216 A1 | 3/2007 | Komiyama et al. | |
| 2007/0158692 A1 | 7/2007 | Nakayama et al. | |
| 2007/0200134 A1* | 8/2007 | Therrien et al. | 257/103 |
| 2007/0228422 A1* | 10/2007 | Suzuki | H01L 27/0605 257/213 |
| 2008/0023706 A1 | 1/2008 | Saito et al. | |
| 2009/0090984 A1 | 4/2009 | Khan et al. | |
| 2010/0267212 A1* | 10/2010 | Morris | 438/275 |
| 2011/0140172 A1* | 6/2011 | Chu | H01L 29/4175 257/194 |
| 2011/0241074 A1 | 10/2011 | Okamoto | |
| 2011/0278598 A1* | 11/2011 | Renaud | H01L 21/746 257/77 |
| 2012/0193676 A1 | 8/2012 | Bobde et al. | |
| 2012/0211800 A1 | 8/2012 | Boutros | |
| 2012/0326215 A1* | 12/2012 | Srivastava et al. | 257/288 |

FOREIGN PATENT DOCUMENTS

| | | |
|---|---|---|
| JP | 2012084653 * | 4/2012 |
| WO | 102714219 | 10/2012 |
| WO | 2012/158464 A2 | 11/2012 |
| WO | 2014/151989 A1 | 9/2014 |

OTHER PUBLICATIONS

P. Srivastava, J. Das, D. Visalli, M. V. Hove, P. E. Malinowski, D. Marcon, S. Lend, K. Geens, K. Cheng, M. Leys, S. Decoutere, R. Mertens, and G. Borghs, "Record Breakdown Voltage (2200V) of GaN DHFETs on Si with 2-μm Buffer Thickness by Local Substrate Removal," IEEE Electron Device Letters, vol. 32, No. 1, pp. 30-32, Jan. 2011.
From U.S. Appl. No. 13/109,212 (now published as US 2012-0211800), Office Action mailed on Nov. 20, 2013.
From U.S. Appl. No. 13/109,212 (now published as US 2012-0211800), Office Action mailed on Jun. 13, 2013.
PCT International Search Report and Written Opinion mailed on Oct. 30, 2012 for related PCT Application No. PCT/US2012/037330 (published as WO 2012/158464 A2).
Chapter II PCT International Preliminary Report on Patentability mailed on May 13, 2013 from related PCT Application No. PCT/US2012/0037330 (published as WO 2012/158464 A2).
W. Saito, et al., "A 120-W Boost Converter Operation Using a High-Voltage GaN-HEMT", IEEE Electron Device Letters, vol. 29, No. 1, pp. 8-10, Jan. 2008.
Y. Wu, et al., "A 97.8% Efficient GaN HEMT Boost Converter With 300-W Output Power at 1 MHz", IEEE Electron Device Letters, vol. 29, No. 8, pp. 824-826, Aug. 2008.
K. Boutros, et al., "GaN Switching Devices for High-Frequency, KW Power Conversion", Proceedings of the 18th International Symposium on Power Semiconductor Devices & IC's, Jun. 4-8, 2006 Naples, Italy.
W. Saito, et al., "High Breakdown Voltage Undoped AlGaN—GaN Power HEMT on Sapphire Substrate and Its Demonstration for DC-DC Converter Application", IEEE Transactions on Electron Devices, vol. 51, No. 11, pp. 1913-1917, Nov. 2004.
K. Boutros, et al., "High Performance GaN HEMTs on 3-inch SI-SiC Substrates", in Proceedings CS ManTech Conference, 23 (2004).
N. Zhang, et al., "Large Area GaN HEMT Power Devices for Power Electronic Applications: Switching and Temperature Characteristics", IEEE, pp. 233-237, 2003.
L.L. Liou, et al., "Thermal Stability Analysis of AlGaAs/GaAs Heterojunction Bipolar Transistors with Multiple Emitter Fingers", IEEE Transactions on Electron Devices, vol. 41, No. 5., pp. 629-636, May 1994.
J. Sewell, et al., "Thermal Characterization of Thermally-Shunted Heterojunction Bipolar Transistors", IEEE Electron Device Letters, vol. 17, No. 1, pp. 19-21, Jan. 1996.
M. Hikita, et al., "AlGaN/GaN Power HFET on Silicon Substrate With Source-Via Grounding (SVG) Structure", IEEE Transactions on Electron Devices, vol. 52, No. 9, pp. 1963-1968, Sep. 2005.
W. Saito, et al., "Suppression of Dynamic On-Resistance Increase and Gate Charge Measurements in High-Voltage GaN-HEMTs With Optimized Field-Plate Structure", IEEE Transactions on Electron Devices, vol. 54, No. 8, pp. 1825-1830, Aug. 2007.
M. Hikito, et. al., "350V/150A AlGaN/GaN power HFET on Silicon substrate with source-via grounding (SVG) structure", IEEE Electron Devices Meeting, IEDM Technical Digest., pp. 803-806, Dec. 2004.
W. Saito, et al., "600V AlGaNlGaN Power-HEMT Design, Fabrication and Demonstration on High Voltage DC-DC Converter", Electron Devices Meeting, IEDM '03 Technical Digest. IEEE International, pp. 23.7.1-23.7.4, Dec. 2003.
PCT International Search Report and Written Opinion mailed on Jul. 30, 2014 for PCT Patent Application No. PCT/US2014/026776 (published as WO 2014/151989 A1).
From EPO Application No. 14767638.1, EPO Supplementary Search Report and Opinion mailed on Nov. 3, 2016.
From Chinese Application No. 201480001977.3, Office Action mailed on May 26, 2017 and its brief English summary.

* cited by examiner

III-NITRIDE TRANSISTOR WITH ENGINEERED SUBSTRATE

CROSS REFERENCE TO RELATED APPLICATIONS

None

TECHNICAL FIELD

This disclosure relates to III-nitride transistors and GaN-on-Si transistors, and in particular to breakdown voltages in III-nitride transistors.

BACKGROUND

GaN-on-Si transistors are suitable for making high-efficiency and low-cost power switching module; however, the voltage breakdown performance of GaN-on-Si transistors is limited by the thickness of the III-nitride epilayer stack. It is challenging to grow III-nitride epilayer stack thicker than 5 micrometers, due to the large thermal mismatch between the III-nitride material and the Si substrate.

It is well known that the Si substrate can limit the breakdown voltage of GaN-on-Si transistors. Bin Lu and Tomas Palacios, "High Breakdown (>1500V) AlGaN/GaN HEMTs by Substrate-Transfer," IEEE Electron Device Letters, vol. 31, no. 9, pp. 951-953, September 2010 describe the removal of the Si substrate, and the subsequent transfer of the device to a glass substrate. Devices showed higher breakdown voltage after the substrate transfer; however, a disadvantage of this approach is that it is difficult to handle large-size wafers with their substrates completely removed, resulting in low yield and high cost.

P. Srivastava, J. Das, D. Visalli, M. V. Hove, P. E. Malinowski, D. Marcon, S. Lenci, K. Geens, K. Cheng, M. Leys, S. Decoutere, R. Mertens, and G. Borghs, "Record Breakdown Voltage (2200V) of GaN DHFETs on Si with 2-µm Buffer Thickness by Local Substrate Removal," IEEE Electron Device Letters, vol. 32, no. 1, pp. 30-32, January 2011 describe an improvement in breakdown voltage after local removal of the Si substrate between the source and the drain. A disadvantage of this approach to improving breakdown voltage is that an unfilled trench in the Si substrate may cause electron trapping problems, which affect the dynamic characteristics of the GaN FETs. In particular the devices with an etched substrate may have poor dynamic on-resistance due to trapping at the substrate/air interface.

What is needed are III-nitride transistors and a method to fabricate III-nitride transistors with improved breakdown voltage that have good performance characteristics and are cost effective to fabricate. The embodiments of the present disclosure answer these and other needs.

SUMMARY

In a first embodiment disclosed herein, a transistor comprises a buffer layer, a channel layer over the buffer layer, a barrier layer over the channel layer, a source electrode electrically connected to the channel layer, a drain electrode electrically connected to the channel layer, a gate electrode on the barrier layer between the source electrode and the drain electrode, a backside metal layer, a substrate between a first portion of the buffer layer and the backside metal layer, and a dielectric between a second portion of the buffer layer and the backside metal layer.

In another embodiment disclosed herein, a transistor comprises a plurality of epi layers, a drain electrode electrically connected to a channel layer in the epi layers, a backside metal layer, a substrate between a first portion of the epi layers and the backside metal layer, and a dielectric between a second portion of the epi layers and the backside metal layer, wherein the backside metal layer is on a side of the epi layers opposite the drain electrode.

In yet another embodiment disclosed herein, a method of fabricating a transistor comprises forming a buffer layer on a substrate, forming a channel layer on the buffer layer, forming a barrier layer on the channel layer, forming a source electrode and a drain electrode on opposite ends of the barrier layer, forming a gate electrode on the barrier layer between the source and drain electrodes, coating the source electrode, the drain electrode, the gate electrode and the barrier layer with a removable material, bonding a carrier wafer to the removable material, etching away a portion of the substrate under the drain, depositing dielectric in the etched away portion of the substrate, depositing backside metal on the substrate and the dielectric, and removing the carrier wafer and the removable material.

In still another embodiment disclosed herein, a method of fabricating a transistor comprises forming a plurality of epi layers on a substrate, forming a drain electrode electrically connected to a channel layer in the epi layers, coating the drain electrode and a top layer of the epi layers with a removable material, bonding a carrier wafer to the removable material, etching away a portion of the substrate under the drain, depositing dielectric in the etched away portion of the substrate, depositing backside metal on the substrate and the dielectric, and removing the carrier wafer and the removable material.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
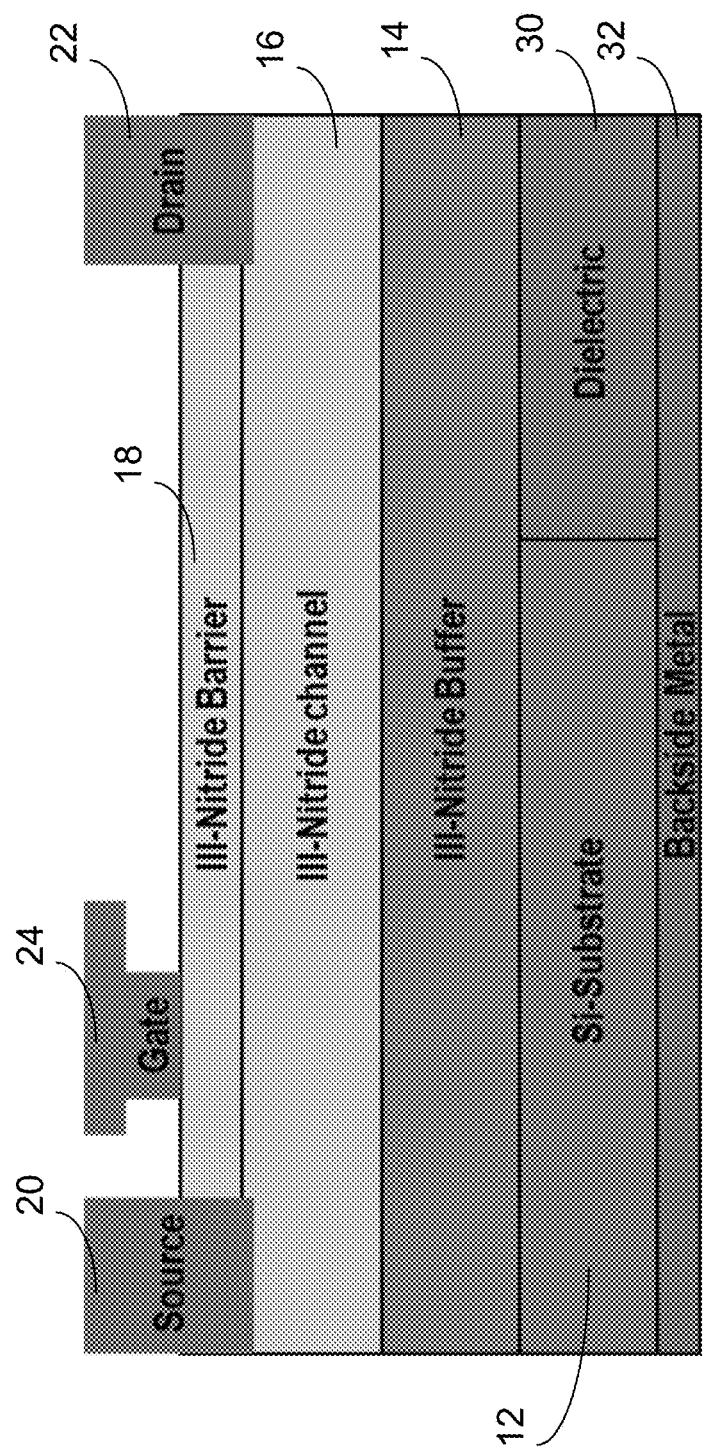
FIG. 1 shows an elevation sectional view of a III-nitride transistor in accordance with the present disclosure.

FIG. 1 shows an elevation sectional view of a III-nitride transistor in accordance with the present disclosure. The substrate 12, which may be silicon (Si), is partially removed in an area underneath the drain 22 and filled with a dielectric 30, which may be benzo-cyclo-butene (BCB). Backside metal 32 is deposited on the backside of substrate 12 as well as the dielectric 30.

For the transistor in FIG. 1 the drain 22 may be at a high voltage and the backside metal 32 may be a ground. Because a silicon substrate 12 is conductive all of the voltage between the drain 22 and the backside metal 32 must be dropped across the III-nitride layers. By removing at least some or all of the substrate 12 underneath the drain 22, and filling it in with a dielectric 30, some of the voltage drop can be across the dielectric 30, which reduces the amount of voltage drop that would otherwise be across the III-nitride layers, thus improving the breakdown voltage of the device. Note that other substrates may also be conductive such as a type of silicon carbide (SiC) substrate.

A buffer layer 14 is over the substrate 12 and the dielectric 30. The buffer layer 14 may be a III-nitride material. A channel layer 16 is over the buffer layer 14, and may be a III-nitride material. Typically the channel layer is un-intentionally doped GaN layer with the thickness ranging from 5 nanometers (nm) to about 2 micrometers. When portion 44 of the substrate 12 is removed, as shown in FIG. 2B, the buffer layer 14 is exposed. Then the area 44 is filled with the dielectric 30. The thickness of the dielectric 30 is substantially the same as a thickness of the substrate 12, as shown in FIG. 1.

A barrier layer 18 is over the channel layer 16, and may be a stack of III-nitride materials. The barrier layer 18 has a greater energy bandgap than the channel layer 16. Typically the barrier layer 18 may be an AlGaN alloy with the Al content of 10~30% and the thickness of 5-30 nanometers (nm).

A source electrode 20 and a drain electrode 22 are on opposite ends of the barrier layer 18 and the channel layer 16, and are typically formed by alloying a stack of Ti/Al/Ni/Au. The source electrode 20 and the drain electrode 22 are in electrical contact with the channel layer 16. A gate electrode 24 is on top of the barrier layer 18, and between the source 20 and drain 22 electrodes.

Transistors with III-nitride on Si, such as GaN-on-Si transistors employing the structure of FIG. 1 have increased breakdown voltage ratings without the necessity of increasing the thickness of the III-nitride epilayers for the buffer layer 14, channel layer 16, and barrier layer 18.

FIGS. 2A to 2D show a method to fabricate a III-nitride transistor in accordance with the present disclosure.

Figure 2A:
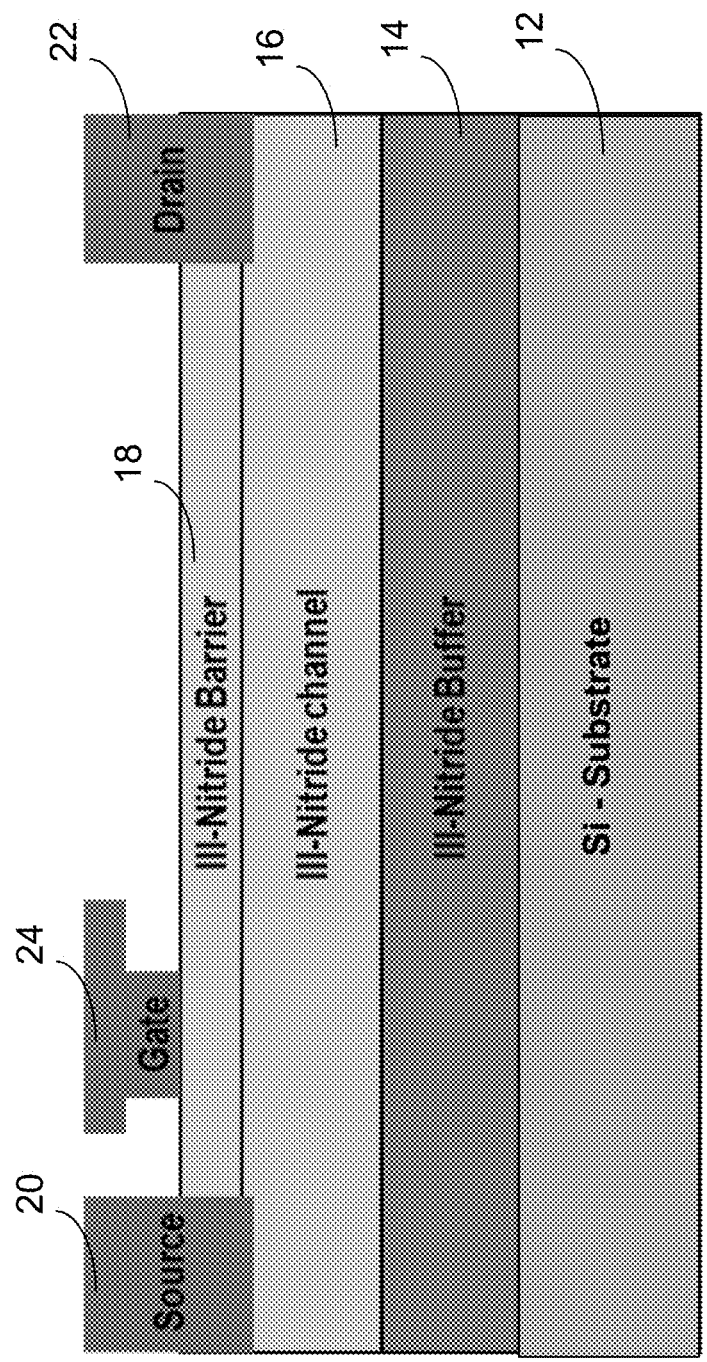
FIGS. 2A to 2D show a method to fabricate a III-nitride transistor in accordance with the present disclosure.
Figure 2B:
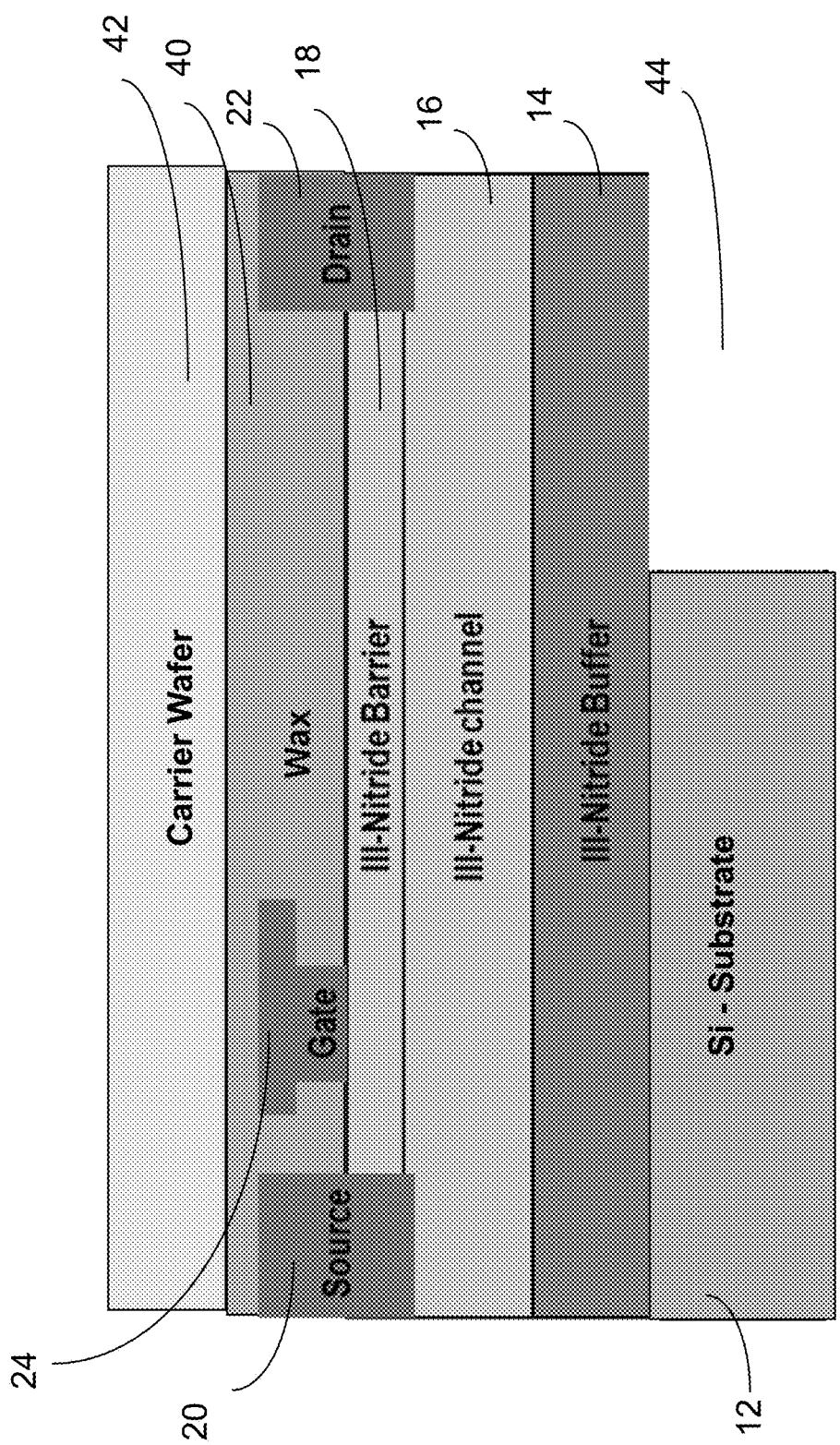

First, as shown in FIG. 2A, a III-nitride transistor is formed by growing a buffer layer 14 on a substrate 12, which may be silicon (Si). The buffer layer 14 may be a stack of III-nitride materials grown on the substrate 12 by chemical vapor deposition or molecular beam epitaxy.

Then a channel layer 16 is grown on the buffer layer 14. The channel layer 16 may be a III-nitride material grown on the buffer layer 14 by chemical vapor deposition or molecular beam epitaxy. Typically the channel layer is un-intentionally doped III-nitride layer, such as GaN, with the thickness ranging from 5 nanometers to a few micrometers.

Next a barrier layer 18 is grown on the channel layer 16. The barrier layer 18 may be a stack of III-nitride materials grown on the channel layer 16 by chemical vapor deposition or molecular beam epitaxy. The barrier layer 18 is formed to have a greater energy bandgap than the channel layer 16. Typically the barrier layer 18 may be an III-nitride, such as an AlGaN alloy with the Al content of 10~30% and the thickness of 5-30 nm.

Then a source electrode 20 and a drain electrode 22 are formed on opposite ends of the barrier layer 18 and the channel layer 16, and are typically formed by alloying a stack of Ti/Al/Ni/Au. The source electrode 20 and the drain electrode 22 are formed in electrical contact with the channel layer 16. Finally, a gate electrode 24 is formed on top of the barrier layer 18, and between the source 20 and drain 22 electrodes.

Next, as shown in FIG. 2B, the structure is mounted onto a carrier wafer 42 after the epi layer and other front side processes, such as forming the electrodes, are complete. The source 20, drain 22, gate 24 electrodes and the barrier layer 18 are coated with a removable material 40 such as wax. Then a carrier wafer 42 is bonded to the removable material 40.

Once the carrier wafer 42 is attached, the entire structure can be turned over and a portion 44 of the substrate 12 under the drain 22 may be etched away by using plasma etching to expose the buffer layer 14. The portion 44 of the substrate 12 that is etched away is underneath the drain 22. The portion 44 is not underneath the source 20 or the gate 24.

Figure 2C:
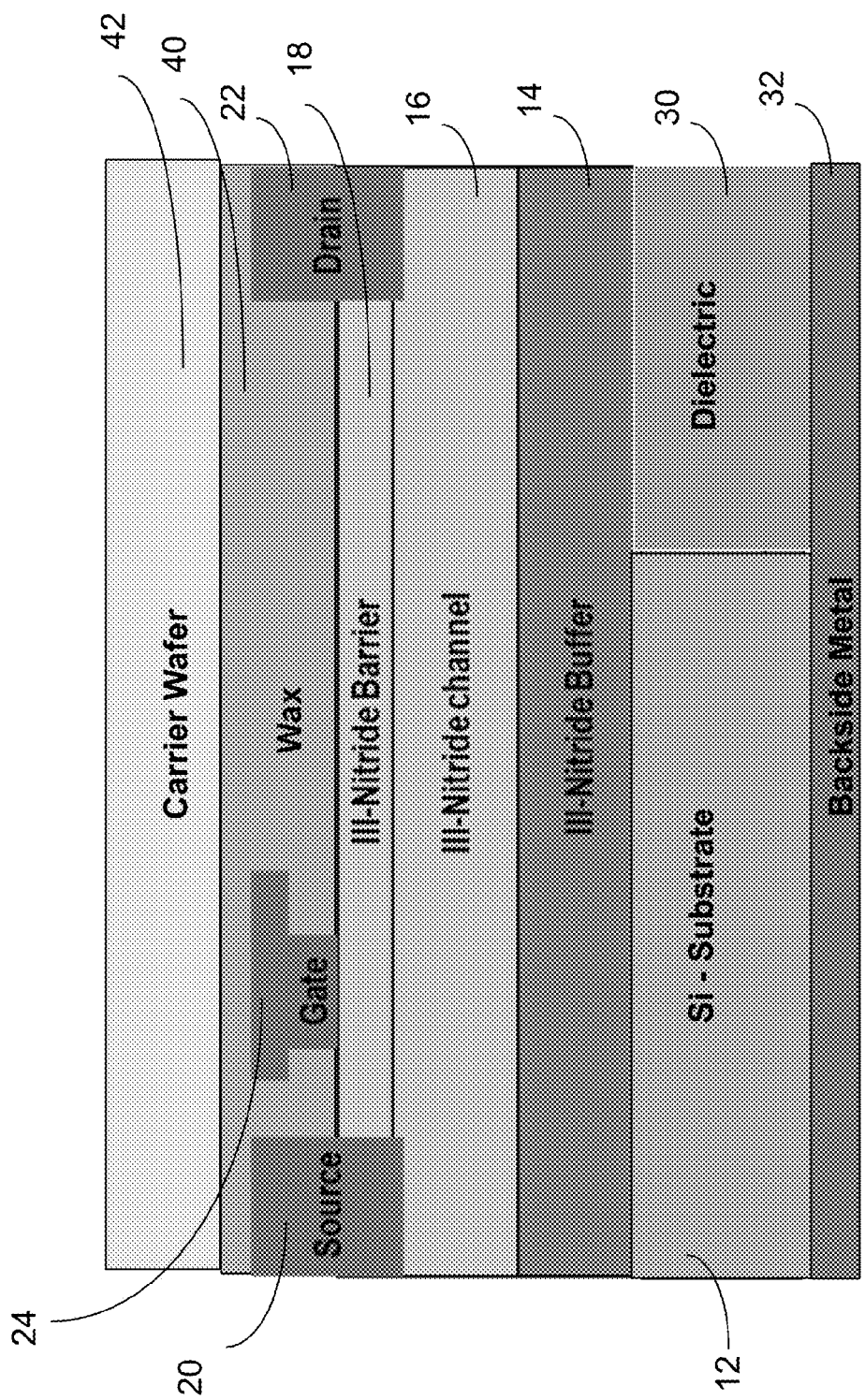
Figure 2D:
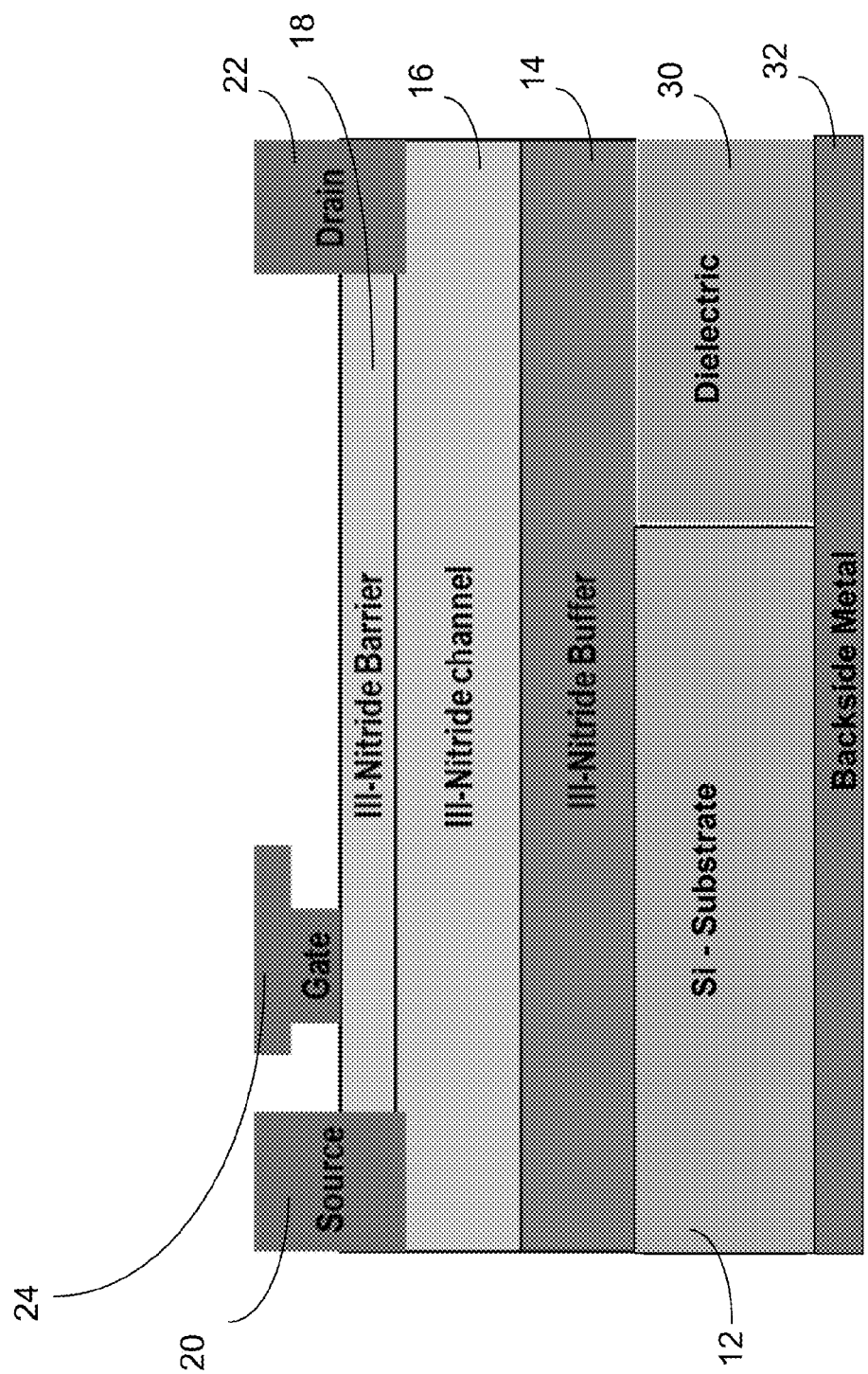

Then, as shown in FIG. 2C, dielectric 30 is coated on the backside of the structure in the area 44 of the etched away substrate, and then polished. Next backside metal 32, such as AuGe, is deposited onto the substrate 12 and the filled dielectric 30. As shown in FIGS. 1, 2C and 2D, the dielectric 30 is underneath the drain 22 and between the drain 22 and the backside metal 32. The dielectric 30 is not underneath the source 20 or the gate 24, as shown in FIGS. 1, 2C and 2D.

Then, as shown in FIG. 2D, the carrier wafer 42 and the wax 40 are removed. The result is the structure shown also in FIG. 1.

As described, foregoing method of selective removal of the substrate and deposition of a dielectric in place of the substrate enhances the breakdown voltage rating of III-nitride devices, such as GaN on Si high electron mobility transistors (HEMTs).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A transistor comprising:
   a buffer layer;
   a channel layer over the buffer layer;
   a barrier layer over the channel layer;
   a source electrode electrically connected to the channel layer;
   a drain electrode electrically connected to the channel layer, wherein the drain electrode has a lateral width along the channel layer;
   a gate electrode on the barrier layer between the source electrode and the drain electrode;
   a backside metal layer;
   a substrate between a first portion of the buffer layer and the backside metal layer; and
   a dielectric between a second portion of the buffer layer and the backside metal layer;
   wherein the backside metal layer is in direct contact with the substrate and the dielectric;
   wherein the dielectric is underneath the entire lateral width of the drain electrode such that the dielectric extends laterally and continuously along the entire lateral width of the drain electrode and is between the drain electrode and the backside metal layer; and
   wherein the dielectric is not underneath the gate electrode.

2. The transistor of claim 1 wherein the dielectric comprises benzo-cyclo-butene (BCB).

3. The transistor of claim 1 wherein:
   the buffer layer comprises a III-nitride material;
   the channel layer comprises a III-nitride material;
   the barrier layer comprises a III-nitride material and has a greater energy bandgap than the channel layer.

4. The transistor of claim 1 wherein the backside metal layer is at a ground voltage.

5. The transistor of claim 1 wherein:
   the channel layer comprises GaN; and
   the barrier layer comprises AlGaN.

6. The transistor of claim 1 wherein:
   the backside metal layer comprises AuGe.

7. The transistor of claim 1 wherein:
   the channel layer has a thickness ranging from 5 nanometers to a two micrometers; and
   the barrier layer has a thickness ranging from 5-30 nanometers.

8. The transistor of claim 1 wherein:
   the substrate between the first portion of the buffer layer and the backside metal layer and the dielectric between a second portion of the buffer layer and the backside metal layer each have substantially a same thickness.

9. The transistor of claim 1 wherein the substrate is silicon or SiC.

10. A transistor comprising:
    a plurality of layers;
    a drain electrode electrically connected to a channel layer in the plurality of layers, wherein the drain electrode has a lateral width along the channel layer;
    a backside metal layer;
    a substrate between a first portion of the plurality of layers and the backside metal layer; and
    a dielectric between a second portion of the plurality of layers and the backside metal layer;
    wherein the backside metal layer is in direct contact with the substrate and the dielectric;
    wherein the dielectric is underneath the entire lateral width of the drain electrode such that the dielectric extends laterally and continuously along the entire lateral width of the drain electrode and is between the drain electrode and the backside metal layer; and
    wherein the dielectric is not underneath a gate electrode.

11. The transistor of claim 10 wherein the plurality of layers comprise III-nitride layers.

12. The transistor of claim 10 wherein:
    the substrate between the first portion of the plurality of layers and the backside metal layer and the dielectric between the second portion of the plurality of layers and the backside metal layer each have substantially a same thickness.

13. The transistor of claim 10 wherein the dielectric comprises benzo-cyclo-butene (BCB).

14. The transistor of claim 10 wherein the substrate is silicon or SiC.

* * * * *